US010748613B2

(12) United States Patent
Kitagawa et al.

(10) Patent No.: US 10,748,613 B2
(45) Date of Patent: Aug. 18, 2020

(54) MEMORY SENSE AMPLIFIERS AND MEMORY VERIFICATION METHODS

(71) Applicant: Micron Technology, Inc., Boise, ID (US)

(72) Inventors: Makoto Kitagawa, Boise, ID (US); Kerry Tedrow, Folsom, CA (US)

(73) Assignee: MIcron Technology, Inc., Boise, ID (US)

( * ) Notice: Subject to any disclaimer, the term of this patent is extended or adjusted under 35 U.S.C. 154(b) by 0 days.

(21) Appl. No.: 16/176,390

(22) Filed: Oct. 31, 2018

(65) Prior Publication Data

US 2019/0066783 A1    Feb. 28, 2019

Related U.S. Application Data

(63) Continuation of application No. 15/791,271, filed on Oct. 23, 2017, now Pat. No. 10,147,487, which is a continuation of application No. 15/096,135, filed on Apr. 11, 2016, now Pat. No. 9,799,398, which is a
(Continued)

(51) Int. Cl.
*G11C 13/00* (2006.01)
*G11C 7/06* (2006.01)
*G11C 11/56* (2006.01)

(52) U.S. Cl.
CPC ........ *G11C 13/0064* (2013.01); *G11C 13/004* (2013.01); *G11C 7/062* (2013.01); *G11C 11/5614* (2013.01); *G11C 13/0011* (2013.01); *G11C 2013/0054* (2013.01); *G11C 2213/79* (2013.01)

(58) Field of Classification Search
CPC .............................. G11C 7/062; G11C 13/004
USPC .............................................. 365/210.11, 208
See application file for complete search history.

(56) References Cited

U.S. PATENT DOCUMENTS 6,490,203 B1    12/2002  Tang
6,788,569 B2    9/2004   Tanizaki et al.
(Continued)

OTHER PUBLICATIONS

Kitagawa et al., U.S. Appl. No. 61/874,861, filed Sep. 6, 2013, titled "Memory Sense Amplifiers and Memory Verification Methods", 49 pages.

*Primary Examiner* — Son L Mai
(74) *Attorney, Agent, or Firm* — Wells St. John P.S.

(57) ABSTRACT

Memory sense amplifiers and memory verification methods are described. According to one aspect, a memory sense amplifier includes a first input coupled with a memory element of a memory cell, wherein the memory element has different memory states at different moments in time, a second input configured to receive a reference signal, modification circuitry configured to provide a data signal at the first input from the memory element having a plurality of different voltages corresponding to respective ones of different memory states of the memory cell at the different moments in time, and comparison circuitry coupled with the modification circuitry and configured to compare the data signal and the reference signal at the different moments in time and to provide an output signal indicative of the memory state of the memory cell at the different moments in time as a result of the comparison to implement a plurality of verify operations of the memory states of the memory cell at the different moments in time.

29 Claims, 9 Drawing Sheets

Related U.S. Application Data continuation of application No. 14/478,894, filed on Sep. 5, 2014, now Pat. No. 9,311,999.

(60) Provisional application No. 61/874,861, filed on Sep. 6, 2013.

(56) References Cited

U.S. PATENT DOCUMENTS

| | | |
|---|---|---|
| 7,073,103 B2 * | 7/2006 | Gongwer ............ G11C 11/5628 |
| | | 714/718 |
| 7,848,138 B2 | 12/2010 | Bedeschi et al. |
| 7,969,804 B1 | 6/2011 | Hirose et al. |
| 8,107,273 B1 * | 1/2012 | Hollmer ................... G11C 8/08 |
| | | 365/148 |
| 8,687,428 B2 | 4/2014 | He et al. |
| 8,995,200 B1 | 3/2015 | Mu et al. |
| 9,153,625 B2 | 10/2015 | Kuono et al. |
| 9,311,999 B2 | 4/2016 | Kitagawa et al. |
| 9,799,398 B2 | 10/2017 | Kitagawa et al. |
| 10,147,487 B2 * | 12/2018 | Kitagawa .............. G11C 13/004 |
| 2001/0019500 A1 | 9/2001 | Banks |
| 2002/0176281 A1 | 11/2002 | Tang |
| 2004/0114444 A1 | 6/2004 | Matsuoka |
| 2015/0070972 A1 | 3/2015 | Kitagawa et al. |
| 2016/0225444 A1 | 8/2016 | Kitagawa et al. |
| 2018/0047446 A1 | 2/2018 | Kitagawa et al. |

* cited by examiner

MEMORY SENSE AMPLIFIERS AND MEMORY VERIFICATION METHODS

RELATED PATENT DATA

This application is a continuation of and claims priority to U.S. patent application Ser. No. 15/791,271, which was filed Oct. 23, 2017, which is a continuation of and claims priority to U.S. patent application Ser. No. 15/096,135, which was filed Apr. 11, 2016, now U.S. Pat. No. 9,799,398, issued Oct. 24, 2017, which is a continuation of and claims priority to U.S. patent application Ser. No. 14/478,894, which was filed Sep. 5, 2014, now U.S. Pat. No. 9,311,999, issued Apr. 12, 2016, which claims priority to and the benefit of U.S. Provisional Patent Application Ser. No. 61/874,861, which was filed Sep. 6, 2013, the teachings of which are incorporated herein by reference.

TECHNICAL FIELD

Embodiments disclosed herein pertain to memory sense amplifiers and memory verification methods.

BACKGROUND

Memory devices are widely used in electronic devices, such as digital cameras and personal audio players, for storing digital data. Many different types of memory are available, each using a different fundamental technology for storing data, and the memory may be volatile or non-volatile memory. Resistive random-access memory (RRAM), conductive-bridge random-access memory (CBRAM) and flash are examples of non-volatile memory.

At least some embodiments described below are directed towards verification operations of memory sense amplifiers and memory verification methods. Some of the disclosed embodiments provide increased speed of verification operations compared with other memory arrangements.

BRIEF DESCRIPTION OF THE DRAWINGS

Example embodiments of the disclosure are described below with reference to the following accompanying drawings.

DETAILED DESCRIPTION OF EXAMPLE EMBODIMENTS

This disclosure is submitted in furtherance of the constitutional purposes of the U.S. Patent Laws "to promote the progress of science and useful arts" (Article 1, Section 8).

At least some embodiments of the disclosure are directed towards memory sense amplifiers and memory verification methods. When programming memory, a plurality of data values may be accessed which are to be written into the memory. Thereafter, memory states of the memory cells are attempted to be written or programmed in accordance with the accessed data values. However, one or more of the memory cells may not be programmed in accordance with the intended data values for various reasons (i.e., the one or more memory cells do not have the correct memory states corresponding to the desired data values). Accordingly, verification operations may be used to verify the memory states of the memory cells following programming. In one embodiment, a data value which was intended to be written into a given memory cell may be referred to as a target data value or target memory state. According to some embodiments described below, the specific target data value or target memory state for a given memory cell may be used to configure a sense amplifier in one of a plurality of different configurations which corresponds to the specific target data value/memory state to be verified and which optimizes the sense amplifier to sense the specific target data value/memory state.

Figure 1:
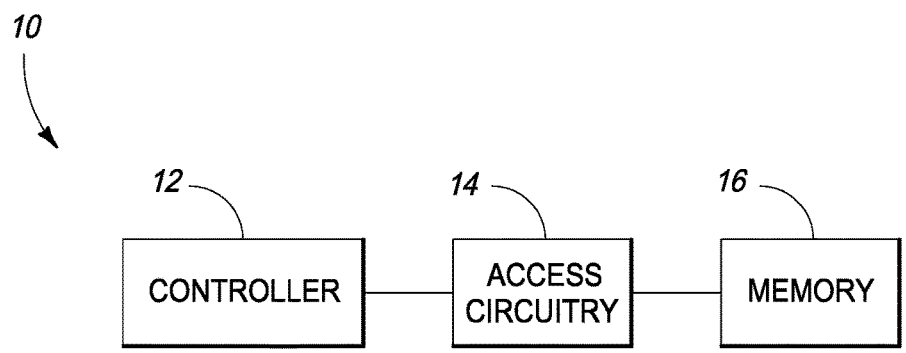
FIG. 1 is a functional block diagram of a memory system according to one embodiment.

Referring to FIG. 1, a functional block diagram of a memory system 10 is shown according to one embodiment. The illustrated memory system 10 includes a controller 12, access circuitry 14, and memory 16. Memory system 10 may be implemented within or with respect to various associated devices (not shown), such as computers, cameras, media players, and thumb drives, in some examples. Memory system 10 stores data generated or utilized by the associated devices in the described examples. Other embodiments of memory system 10 are possible and may include more, less and/or alternative components or circuitry.

Controller 12 controls operations of writing, reading and re-writing data of memory 16 as well as interfacing with other components or circuitry, such as sources of data to be stored within memory 16. Controller 12 may access and process commands with respect to memory 16 during operations of an associated device. Example commands instruct the generation of program (reset) and erase (set) voltage potentials which are applied to memory 16 in one embodiment. The program and erase operations are used to write data to memory (i.e., program the memory) and are both referred to as write operations in one embodiment. Controller 12 may also control the application of read and verify pulses to memory 16 to read and verify stored data in one embodiment.

In one embodiment, controller 12 is configured to process data, control data access and storage, issue commands, and control other desired operations. Controller 12 may comprise processing circuitry configured to execute programming provided by appropriate computer-readable storage media (e.g., memory) in at least one embodiment. For example, the controller 12 may be implemented as one or more processor(s) and/or other structure configured to execute executable instructions including, for example, software and/or firmware instructions. Other example embodiments of controller 12 may include hardware logic, PGA, FPGA, ASIC, state machines, and/or other structures alone or in combination with one or more processor(s). These examples of controller 12 are for illustration and other configurations are possible.

Access circuitry 14 is coupled with controller 12 and memory 16 and is configured to implement addressing (selection of columns and rows of memory 16), writing, reading, verifying and re-writing operations with respect to memory cells of memory 16 in one embodiment. For example, access circuitry 14 may receive instructions from controller 12 to select a specific block, page, word or byte of the memory 16 as well as to implement writing, reading, verifying and re-writing with respect to a plurality of cells of the selected block, page, word or byte. As discussed below, the access circuitry 14 may apply electrical voltage potentials to the memory 16 to perform write, read and verification operations in one embodiment.

Memory 16 includes a plurality of memory cells configured to store data, conductors electrically connected with the memory cells, and perhaps additional circuitry, for example circuits of the access circuitry 14. At least some of the memory cells are individually capable of being programmed to a plurality of different memory states at a plurality of moments in time. Memory 16 is accessible to the user and/or associated device for storage of digital information. The memory cells may be configured as non-volatile cells in some implementations and may have different electrical resistances corresponding to different memory states. In one specific example implementation, memory 16 is implemented as conductive bridge random access memory (CBRAM) and the memory cells are conductive bridge memory cells.

Memory 16 may be implemented in different arrangements in different embodiments. For example, the memory 16 may be implemented within a memory device, such as a chip, a portion of the chip (e.g., tiles and/or sub-tiles discussed below) or other arrangements. The memory device may also include controller 12 and/or access circuitry 14 or portions thereof.

Figure 2:
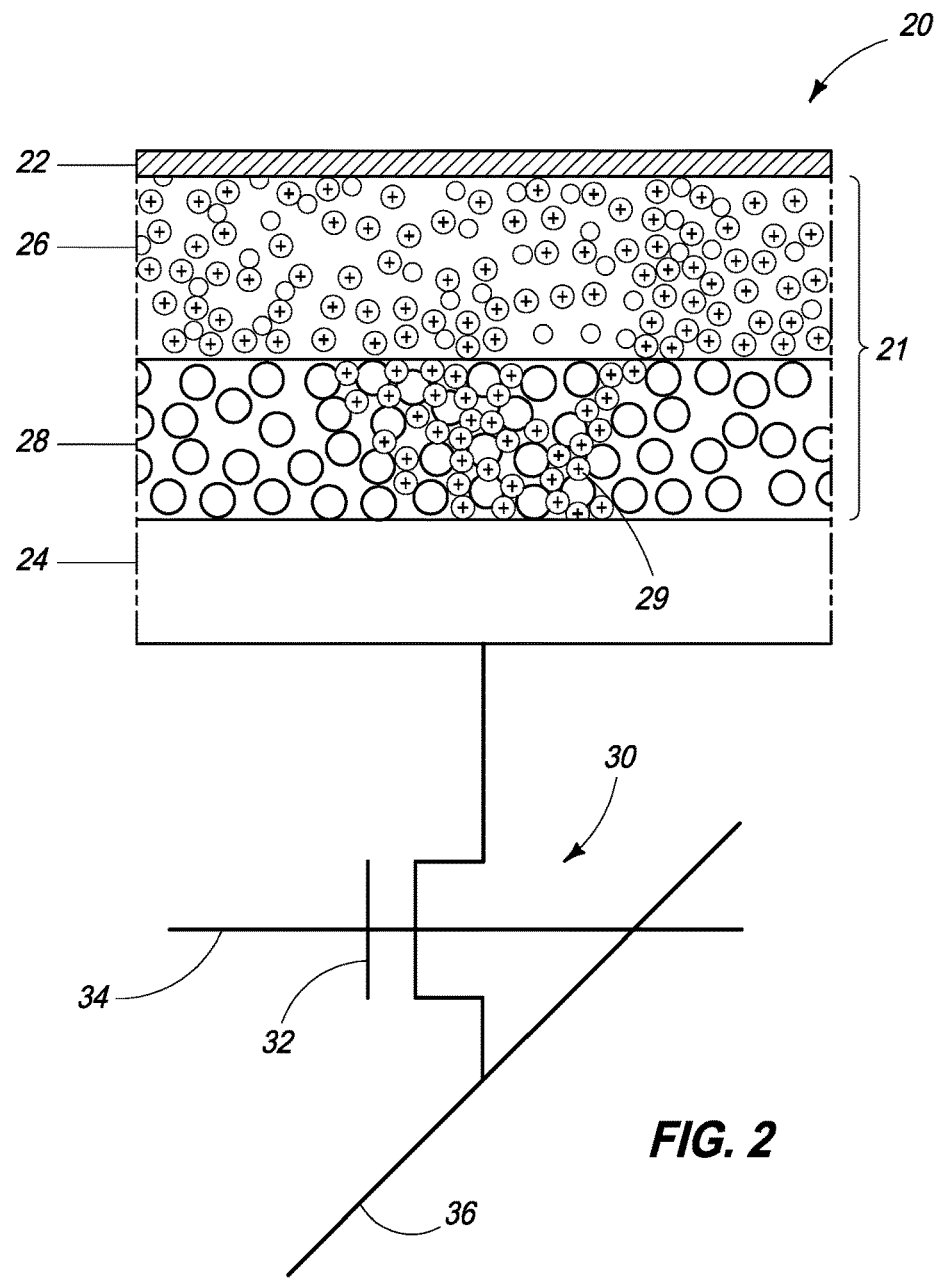
FIG. 2 is an illustrative representation of a memory cell according to one embodiment.

Referring to FIG. 2, an example of a memory cell 20 of memory 16 is shown. The illustrated example memory cell 16 is a one transistor/one resistor (1T1R) CBRAM memory cell. Other types of memory cells may be utilized in other embodiments. For example, the disclosed sense amplifiers and verification operations may also be utilized to sense ReRAM, PCM, MRAM, Spin RAM, and flash memory (1T, 1R, 1T1R, and 1D1R).

The example memory cell 16 includes a top electrode 22, memory element 21 and bottom electrode 24. Top and bottom electrodes 22, 24 comprise electrically conductive material and may also be referred to as first and second electrodes (or vice versa) of the memory cell 20 in one embodiment.

The illustrated embodiment of memory element 21 includes an electrically conductive source member or layer 26 and a dielectric layer 28 intermediate the electrodes 22, 24. In one embodiment, the source layer 26 is a Cu+ source layer (e.g., CuTe), example materials of the dielectric layer 28 include AlOx, HfOx, and ZrOx, and the bottom electrode 24 is titanium nitride (TiN). Other embodiments are possible. Top electrode 22 may be coupled with or part of a conductive common source line or plate as discussed in further detail below.

The memory cell 20 shown in FIG. 2 includes one or more conductive structures 29 (e.g., filaments) in a low resistance state which may correspond to one of a plurality of different memory states (e.g., a "one" or "zero" in an example binary application) of the memory cell 20. The memory cell 20 may also be programmed to a high resistance state where the conductive structures 29 are removed and not present and which may correspond to another of the different memory states. Different write voltage potentials may be applied across top and bottom electrodes 22, 24 to change the resistance (and memory state) of the memory cell 20.

More specifically, an erase/set programming operation may be performed by the application of a voltage potential/bias to the top electrode 22 which is more positive than the voltage potential/bias applied to the bottom electrode 24. The application of these signals causes inducement of Cu ions into dielectric layer 28 and formation of one or more electrically conductive structures 29 (e.g., filaments) through dielectric layer 28 and between conductive source layer 26 and bottom electrode 24. The formation of the structures 29 provides the memory cell 25 in a low resistance state. In one embodiment, the structures 29 comprise material (e.g., copper) from the source layer 26.

A memory cell 20 having the conductive structures 29 may be programmed in a program/reset operation to a high resistance state by the application of a voltage potential/bias to the bottom electrode 24 which is more positive than the voltage potential/bias applied to the top electrode 22. The application of these signals cause Cu ions to return into source layer 26 and dissolves any electrically conductive structures 29 within dielectric layer 28, thereby increasing the electrical resistance of the memory element 21 between the electrodes 22, 24 and providing the memory cell 20 in a high resistance state.

Memory cell 20 being may be repeatedly written between the high and low resistance arrangements at different moments in time to store different data values corresponding to the different memory (e.g., resistive) states. In one embodiment, a current is passed through the memory cell 22 and sense circuitry may measure the current to determine the resistance and memory state of the memory cell 20.

FIG. 2 also illustrates an access transistor 30 (e.g., NMOS) having a gate 32 coupled with a word line 34 and plural terminals coupled with bottom electrode 24 and a bit line 36. Word line 34 is used to select the memory cell 20 for reading/writing/verification and bit line 36 is used to conduct appropriate signals for the reading/writing/verification of the memory cell 20.

Figure 3:
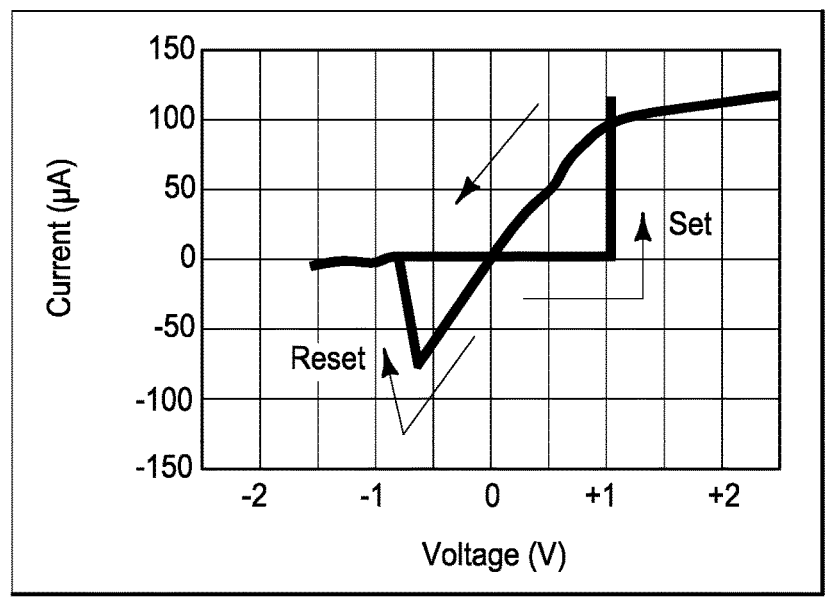
FIG. 3 is a graphical representation of plural memory states of a memory cell according to one embodiment.

FIG. 3 illustrates an IV curve of an example 50 nm CBRAM memory cell 20 in a voltage sweeping mode wherein the voltage polarity across the cell in a set/reset operation is defined as plus/minus, respectively. As shown, the memory cell is provided in a high resistive state (HRS) during a reset operation and is provided in a low resistive state (LRS) during a set operation.

Figure 4:
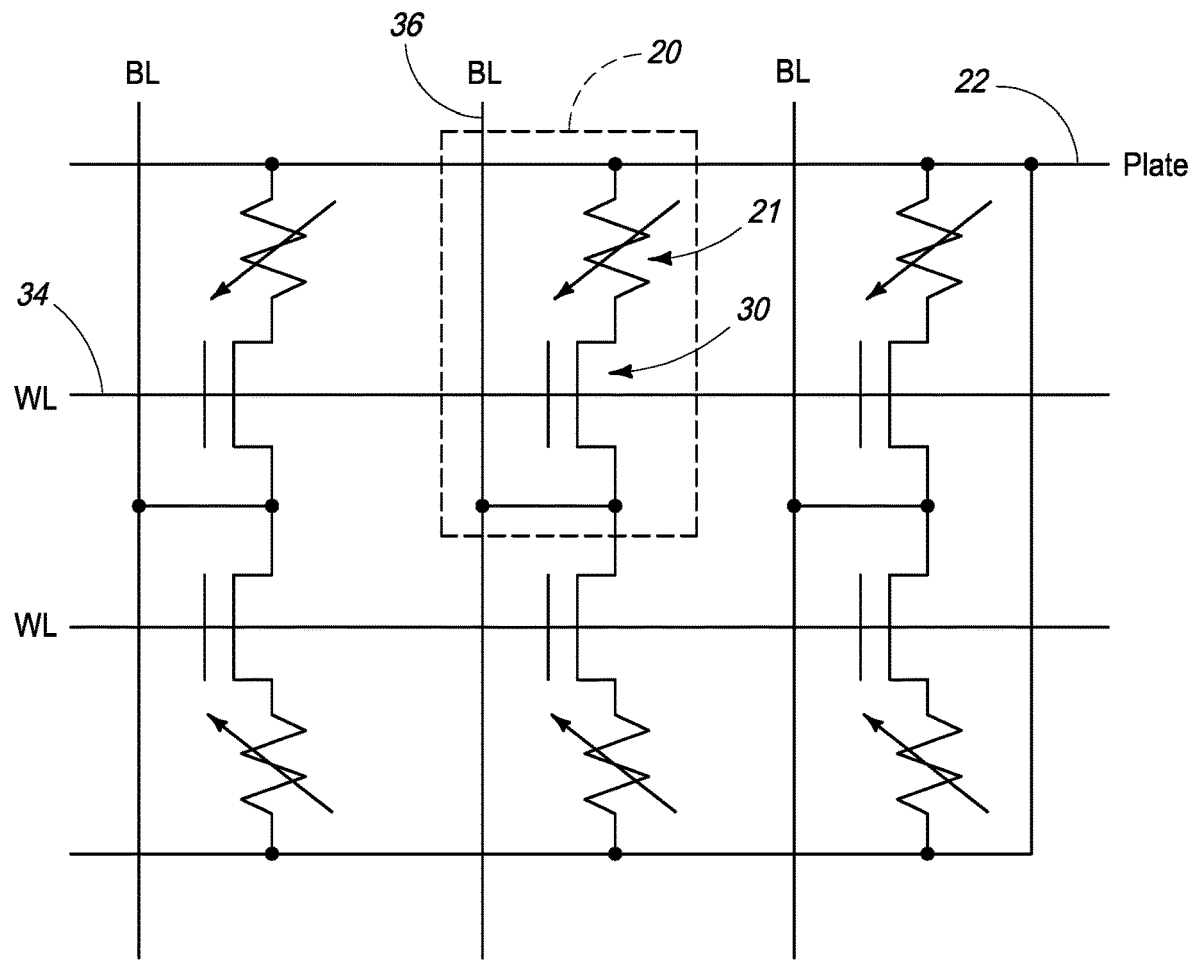
FIG. 4 is a schematic representation of a plurality of memory cells according to one embodiment.

Referring to FIG. 4, a plurality of memory cells 20 are coupled with a plurality of bitlines 36, wordlines 34, and plate electrode 22. Other arrangements of the memory cells 20 are possible.

Figure 5:
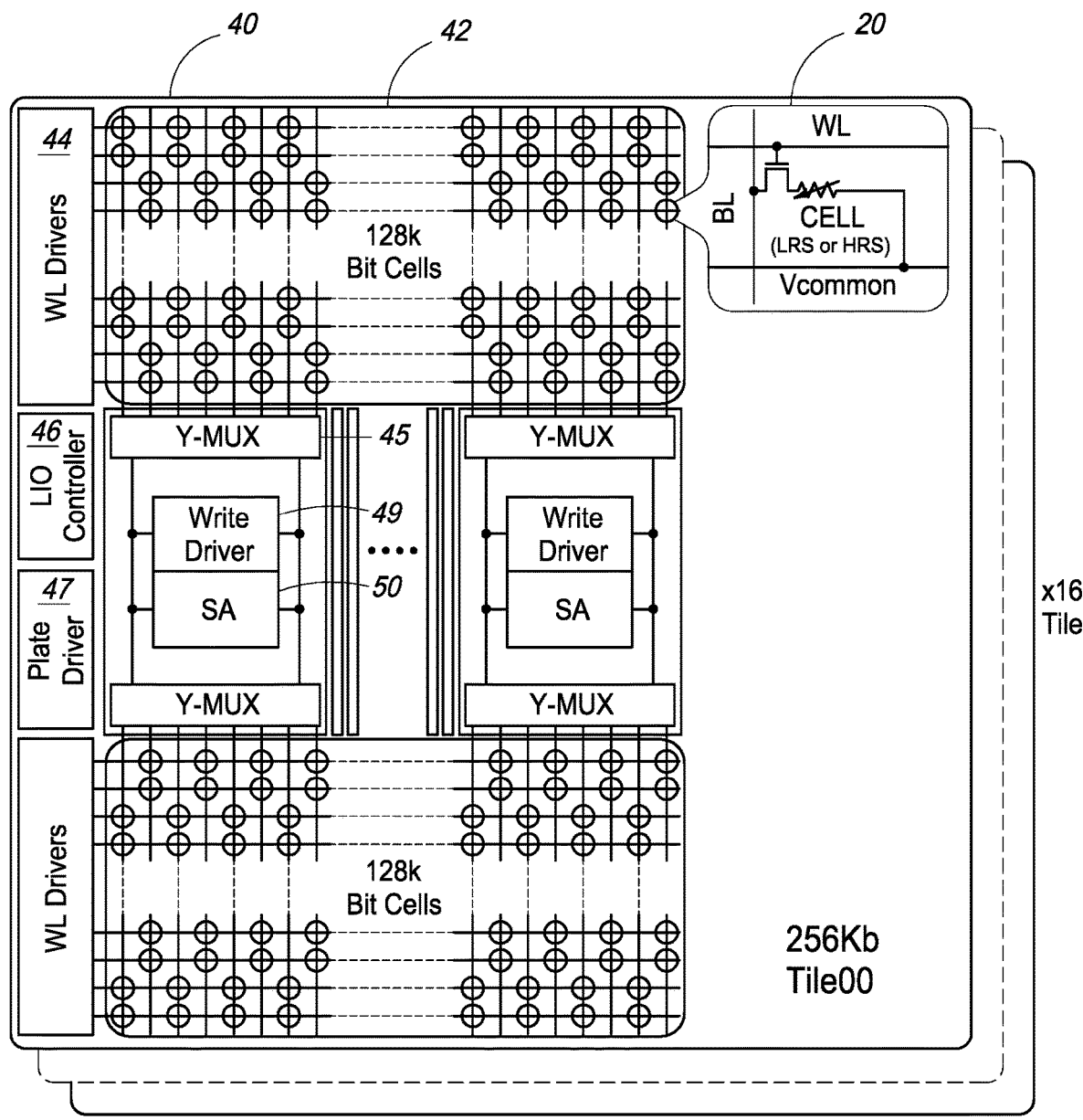
FIG. 5 is an illustrative representation of a tile of a memory chip according to one embodiment.

Referring to FIG. 5, a tile 40 of a memory device is shown according to one embodiment. The memory device may comprise a memory chip in one embodiment and which may include a plurality of tiles 40 (e.g., 16 tiles in the illustrated example).

The depicted tile 40 includes a memory array 42 of a plurality of memory cells 20 which may be individually addressed by WL drivers 44 and Y-MUX circuitry 45. The tile 40 additionally includes an LIO controller 46, Vcommon driver 47, RRef 48, write driver 49 and a sense amplifier 50 in the illustrated embodiment. Tile 40 includes sixty-four of individual circuits 48, 49 and 50 to interface with a plurality of memory cells 20 of array 42 in parallel in one embodiment. LIO controller 46 provides interfacing of the sense amplifiers 50 of a given bank of the tile 40 to a databus (not shown) which is shared between multiple banks and also interfaces with an I/O block of the memory chip. Plate voltage driver 47 drives the plate voltage to the various voltage values utilized for reading and writing. The write driver 49 drives the bitline voltage to the various voltage values utilized for writing. Sense amplifiers 50 sense the memory states of memory cells 20 during read and verification operations. Additional details and operations of sense amplifiers 50 are described below in example embodiments.

It is desired in some embodiments to increase the speed of verification operations. In one embodiment, set and reset cells are verified at the same time using multiple sense amplifiers in parallel which is faster than verifying set and reset cells in series. Set and reset cells may be verified in series in other embodiments. The time or speed for the example configuration of the sense amplifier discussed below with respect to FIG. 6 to sense the cell current is proportional to the magnitude of the current. As discussed above, memory element 21 of memory cell 20 is configured to have different electrical resistances in different memory states. For example, memory element 20 has a relatively high resistance in a reset state (also referred to as high resistive state or HRS) compared with a set state (also referred to as a low resistive state or LRS).

As discussed below, some embodiments of the sense amplifiers 50 of the memory device perform operations to increase the speed during verify of reset memory cells. Furthermore, reset verify operations may be performed at the same time as (in parallel with) set verify operations even though the memory cell has a higher electrical resistance in the reset state than during the set state. In some embodiments, the target data value (0, 1) or corresponding target memory state (HRS or LRS) which was attempted to be written to the respective memory cell 20 being verified may be used to implement the operations including tailoring the sense amplifier 50 to sense the cells currents of the target memory state.

Figure 6:
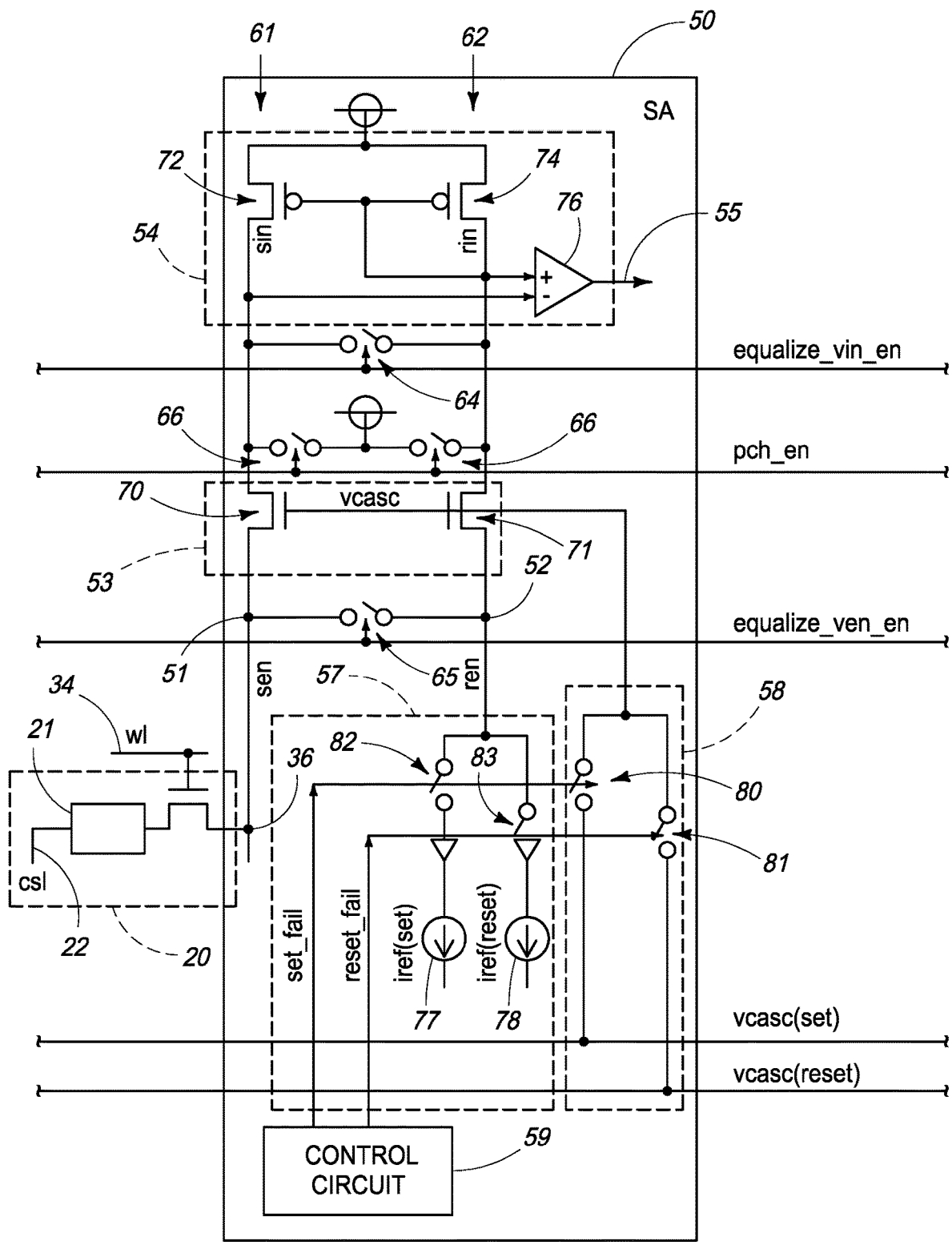
FIG. 6 is a schematic representation of a sense amplifier according to one embodiment.

Referring to FIG. 6, one embodiment of sense amplifier 50 is shown. The illustrated sense amplifier 50 includes plural inputs 51, 52 which receive a data signal (corresponding to the cell current) and a reference signal, respectively. In particular, input 51 is coupled with bitline 36 and input 52 is coupled with reference circuitry 57 configured to provide one or more reference signals as discussed further with respect to example embodiments below. Although only one memory cell 20 is shown in FIG. 6, typically numerous additional memory cells 20 may also be coupled with bitline 36 and which are individually addressable to be sensed via respective wordlines 34.

The sense amplifier 50 additionally includes modification circuitry 53 coupled with the first and second inputs 51, 52 and amplification and comparison circuitry 54 coupled with modification circuitry 53. In one embodiment, modification circuitry 53 is configured to provide the data signal at a regulated voltage for sense operations including cell verification operations. As discussed further below, modification circuitry 53 may be implemented using cascade circuitry in a more specific example embodiment. Furthermore, reference circuitry 57 is coupled with second input 52 as mentioned above, supply circuitry 58 is configured to supply one or more voltage biases during verification operations as discussed in additional detail below, and control circuit 59 is configured to control operations of the sense amplifier 50 (for example using a target data value or memory state) as also discussed in additional detail below.

In one embodiment, sense amplifier 50 provides comparison operations of the data signal with the reference signal during sense operations and includes a plurality of paths, namely a data path 61 and a reference path 62. However, in one embodiment, and prior to the comparison, modification circuitry 53 provides the data and reference signals at desired voltage values according to the target data value which was previously attempted to be written to the memory cell 20 and which is to be verified. In one embodiment, modification circuitry 53 is configured to provide the data signal and reference signal at different voltages corresponding to respective ones of different memory states of the memory cell to be verified as discussed in additional below.

In the illustrated embodiment, modification circuitry 53 includes a plurality of cascode transistors 70, 71 individually within one of the respective data path 61 and reference path 62. Cascode transistors 70, 71 set the voltages of the data signal and reference signal at respective inputs 51, 52 where input 51 is the bitline and the voltage of input 70 may be referred to as the bitline voltage.

Still referring to FIG. 6, supply circuitry 58 provides a first voltage bias vcasc(set) to the gates of cascode transistors 70, 71 during set verify operations and provides a greater, second voltage bias vcasc(reset) to the gates of cascode transistors 70, 71 during reset verify operations. The provision of the different gate bias voltages provides the data signals and reference signals with different voltages during different memory states of the memory cell.

As mentioned previously, the current of the data signal (also referred to as cell current) for a reset verify operation is lower than the current of the data signal for a set verify operation due to the electrical resistances of the memory cell 20. Some of the example embodiments discussed below increase the speed of verification operations of reset cells (which otherwise would be slower due to the reduced currents of the memory cell in the reset (high resistive state)) thereby increasing the speed of the overall verification operations of the memory device. Furthermore, in some embodiments, the verification of the reset cells may be performed in parallel with the verification operations of set cells. In one embodiment, the target state of the memory element or cell (i.e., the state or value which was attempted to be written to the respective memory element or cell) is used to implement the reset and set verification operations and to increase the verify sensing speed of reset cells by the sense amplifier 50.

In one embodiment, the target state of the memory element or cell is used to determine which of the plurality of voltage biases is used for set and reset verification operations. For example, a data latch of control circuit 59 may indicate which data value or memory state the memory cell 20 should be placed into following the previous write operation. This value is used to control one or more operations of the sense amplifier 50 to improve the verification speed with respect to reset cells as discussed in detail below.

In one more specific embodiment, the data of the memory cell (set or reset) is used to select an appropriate one of plural bias voltages for cascode transistors 70, 71 for implementing set and reset verification operations. The cascode transistors 70, 71 set the respective SEN and REN bitline voltages and are each approximately the gate voltage minus the threshold voltage of the respective transistor 70, 71. As discussed above, the cell current is less when the memory cell is in the high resistive state compared with the low resistive state. When attempting to verify a reset memory cell (HRS), it is desired to provide an increased gate bias voltage to the cascode transistors 70, 71 compared with the gate bias voltage used to verify a set memory cell (LRS). More specifically, the higher gate bias voltage provides the bitline voltage at input 51 at an increased voltage compared with the bitline voltage which would result from the use of the bias voltage which is the same as used during a set verify operation. The application of the increased bias voltage (e.g., vcasc(reset)=1 V) to the gates of the transistors 70, 71 results in the data and references signals each having a higher voltage of approximately 500 mV compared with the voltage of 200 mV if the lower bias voltage (e.g., vcasc(set) =700 mV) was used. Accordingly, the data signals and reference signals have different characteristics corresponding to different states of the memory cell in one embodiment.

The use of the increased voltage results in the data signal having increased current for reset verify (e.g., 1.2 microA) which enables increased sensing speed of the sense amplifier 50 (since sense speed is proportional to the current) and compared with use of the lower voltage bias which would result in the data signal having a smaller current (e.g., 0.15 microA).

It is noted that the use of increased voltages during read operations may disturb the state of the respective memory cell, however, for verify operations the memory cell is not exposed to the increased voltage provided by the increased bias voltage for a prolonged period of time or for numerous cycles (e.g., millions of read cycles) and the state of the memory cell being verified is not disturbed.

Accordingly, in one embodiment, supply circuitry 58 is configured to provide the vcasc(reset) voltage bias for verifying a reset memory state and which has a larger voltage bias than the voltage bias of vcasc(set) which is used for verifying a set memory state. If the data latch indicates that a set data value was to be written as the target, then switch 80 is closed to apply the vcasc(set) voltage bias to the gates of the cascode transistors 70, 71 while switch 81 is closed to apply the vcasc(reset) voltage bias to the gates of the cascode transistors 70, 71 if the data latch indicates that a reset data value was to be written as the target in the presently described embodiment. The application of the increased voltage bias to the cascode transistors 70, 71 during reset verify results in the data and reference signals having increased voltages and current during reset verify operations compared with the arrangements which use the same bias voltage for reset verify operations as the set verify operations.

The different cell currents in the high and low resistance states of the memory cell are significantly different which presents problems with respect to sensing of cell currents in both memory cell states by the sense amplifier 50. In particular, the sense amplifier may be slow while performing reset verify operations due to the smaller reset cell current. At least some of the embodiments above provide apparatus and methods to collapse the difference of the cells currents in the high and low resistance states of the memory cell to be closer to one another and within a smaller current range for sensing by the sense amplifier. For example, the use of the different cascode gate voltages during respective set verify and reset verify operations provides the data signals having currents of approximately 1.5 and 1.2 microA as discussed above compared with arrangements which use the same cascode gate voltage during respective set verify and reset verify operations and resulting in currents which may be 10× different from one another. Accordingly, the sense amplifier 50 may be optimized to sense on a smaller range of currents in some embodiments.

According to one embodiment, reference circuitry 57 is configured to provide a plurality of different reference signals to second input 52 corresponding to the different target data written to the respective memory cell 20 which provides additional flexibility during verification operations compared with arrangements which use a constant reference current. In one embodiment, reference circuitry 57 includes plural current sources 77, 78 which provide reference signals having different currents. For example, in one embodiment described above, current sources 77, 78 may provide currents corresponding to expected cell currents of memory cell 20 in both low and high resistive states (e.g., 1.5 microA and 1.2 microA), respectively. If control circuit 59 indicates that the memory cell 20 should be in a set state according to the target, then switch 82 may be closed to couple current source 77 with second input 52 to provide a reference current of 1.5 microA. If control circuit 59 indicates that the memory cell 20 should be in a reset state according to the target, then switch 83 may be closed to couple current source 78 with second input 52 to provide a reference current of 1.2 microA. In another embodiment, reference circuitry 57 provides a constant reference current or reference signals having other currents than those described above.

The data signal and reference are provided to amplification and comparison circuitry 54 which amplifies and compares the data and reference signals from the cascode transistors 70, 71 with one another to generate an output signal at output 55 which may be used to determine whether the data value is verified or not. Circuitry 54 includes PMOS transistors 72, 74 arranged in a current mirror configuration in the illustrated embodiment and which may be referred to as current mirror transistors. The data and reference signals at nodes sin and rin develop a differential voltage which are equal if the currents of the data and reference signals are equal in one embodiment.

The differential voltage is compared using comparator 76 in the depicted embodiment which provides a logical value (e.g., 1) if the current of the data signal is greater than the current of the reference signal and otherwise provides another logical value (e.g., 0). Additional logic circuitry receives the output signal and determines whether the memory cell in a target set state is verified (e.g., current of the data signal is at least 1.5 microA) or determines whether the memory cell in a target reset state is verified (e.g., current of the data signal is less than 1.2 microA) in one embodiment. Additional write and/or verify operations may be performed if the current verify operation fails in one implementation.

Equalization and pre-charge operations may be implemented in some embodiments prior to comparison of the data signal and the reference signal. In one embodiment, the equalization and pre-charge operations begin simultaneously when a new verify operation is to be performed following a previous write or verify operation.

For the equalization operation, switches 64, 65 are closed which operate to short the sin and rin nodes of circuitry 54 and provide the sense amplifier 50 in an equalized state from a previous state. For the pre-charge operation, switches 66 shunt the current mirror transistors 72, 74 by coupling the sin and rin nodes to the supply voltage and which provides faster bit line charging compared with arrangements which do not use pre-charge operations. While equalization and pre-charge may begin simultaneously, the pre-charge is disabled before the equalization operations in one embodiment. Thereafter, the differential voltages develop within the current mirror of the amplification and comparison circuitry 54 and which may be compared to determine whether the state of the memory cell is verified or not. In one embodiment, the sense amplifier 50 for a given bit may be turned off once the bit has been verified and during additional verification operations for different bits by other sense amplifiers 50 of the memory device.

The control lines set_fail and reset_fail are utilized to implement verification operations of set and reset target memory states of a memory cell, respectively. In one embodiment, all sense amplifiers 50 are enabled for the first verify operation following a write operation and have one of their respective set_fail and reset_fail control lines asserted according to the target of the respective memory cells to be verified. In some embodiments, additional verification operations may be needed with respect to one or more memory cells which failed to verify. Once a given memory cell has been verified, the respective sense amplifier 50 for the given memory cell may be turned off while subsequent verification operations of other memory cells are performed in one embodiment.

In addition, pre-read operations may be implemented in some embodiments where memory cells may also be verified prior to application of write pulses to the memory cells. For example, users often write random data over previous random data and there is a high probability that the new data bit is equal to the old data bit, and accordingly a write pulse is not required if the new and old bits are equal.

Figure 7:
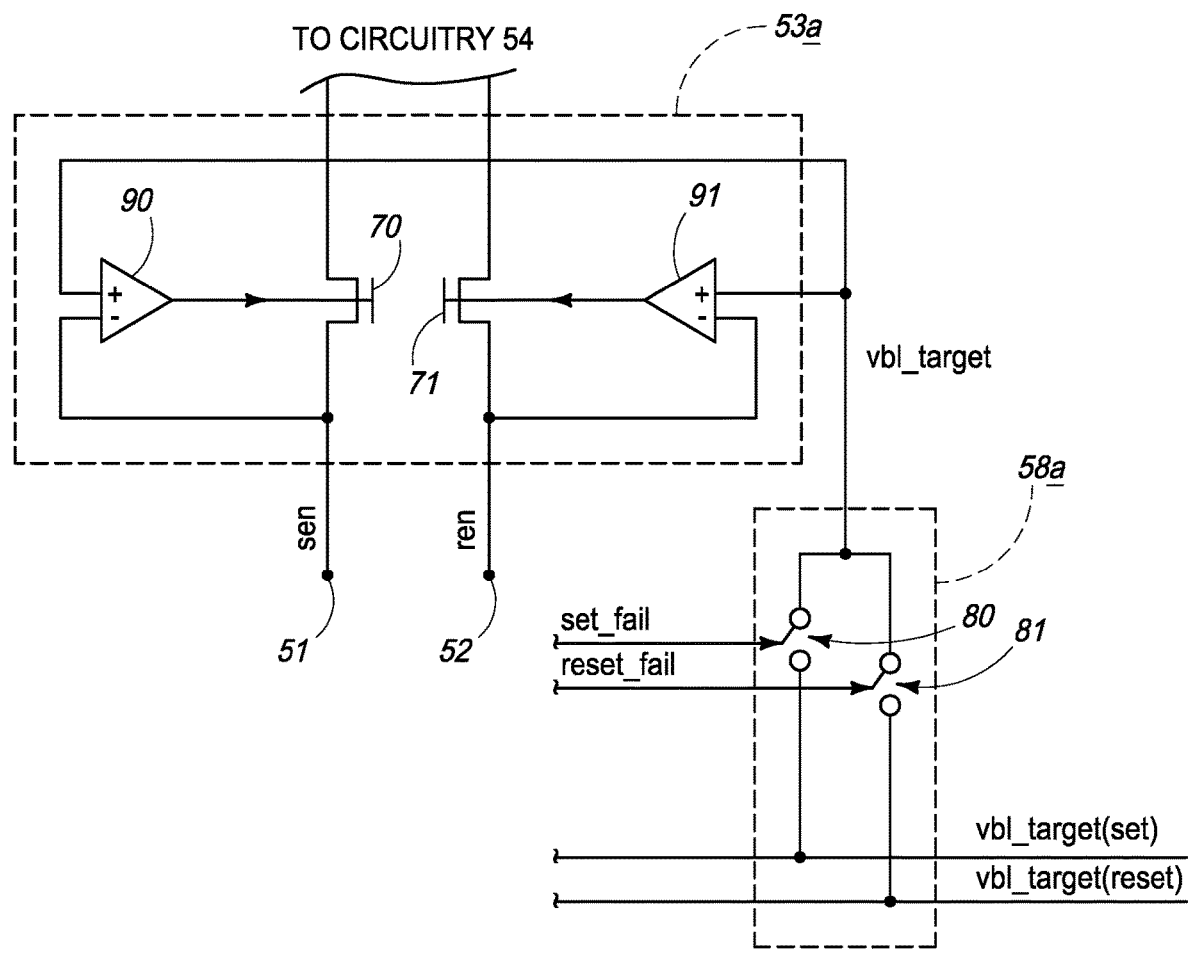
FIG. 7 is a schematic representation of modification and supply circuitry according to one embodiment.

Referring to FIG. 7, other configurations of modification circuitry 53*a* and supply circuitry 58*a* are shown. Modification circuitry 53*a* includes cascode transistors 70, 71 with respective op-amps 90, 91 provided in a feedback arrangement for the data and reference paths and which regulate the voltages at inputs 51, 52. At equilibrium, the voltages of inputs 51, 52 will be equal to Vbl_target provided by supply circuitry 58*a* where Vbl_target is the target bitline voltage (e.g., 200 mV and 500 mV for set and reset, respectively). The equilibrium point of the feedback arrangement is the point where the two inputs of op-amp 90 or 91 are at approximately equal voltage and the op-amp output voltage is the cascode gate voltage utilized to produce the desired bitline voltage (e.g., approximately 500 mV higher than the target bitline voltage).

Figure 8:
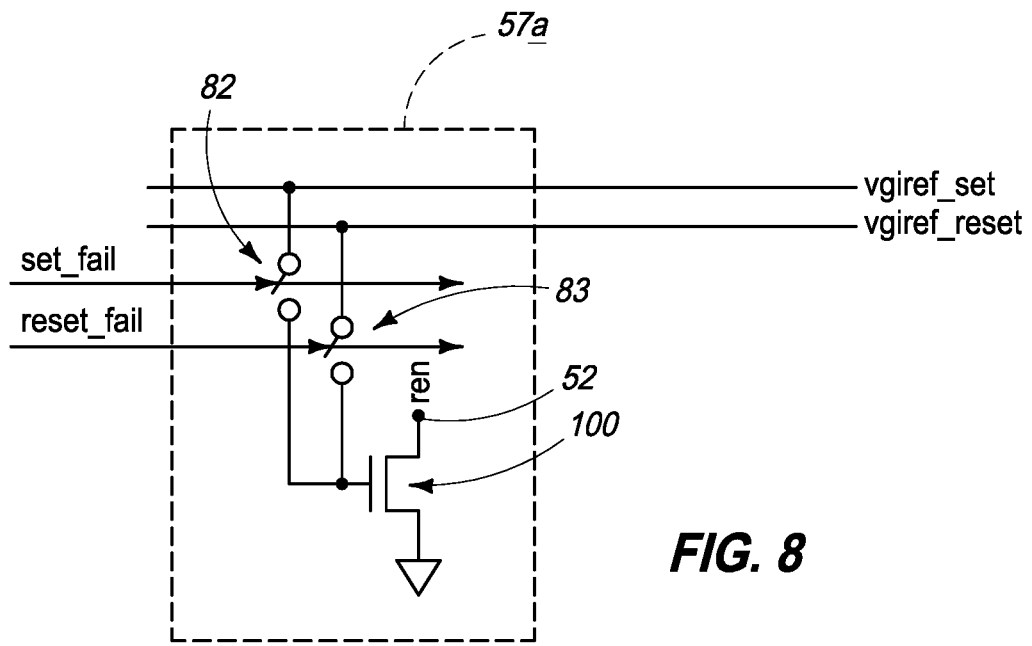
FIG. 8 is a schematic representation of reference circuitry according to one embodiment.

Referring to FIG. 8, another configuration of reference circuitry 57*a* is shown. Reference circuitry 57*a* includes an NMOS transistor 100 coupled with switches 82, 83 and input 52. Plural bias voltages vgiref_set and vgiref_reset are selectively coupled by respective switches 82, 83 to the gate of transistor 100 corresponding to whether the target state of the memory cell to be verified is a set state or reset state, respectively. The transistor 100 and voltage sources may be configured to provide different set and reset reference currents which correspond to the expected currents of the data signal in the set and reset states, respectively, in one embodiment. In one embodiment, vgiref_set is larger than vgiref_reset to provide reference signals having currents during set verify operations which are greater than the currents of reference signals used during reset verify operations.

Figure 9:
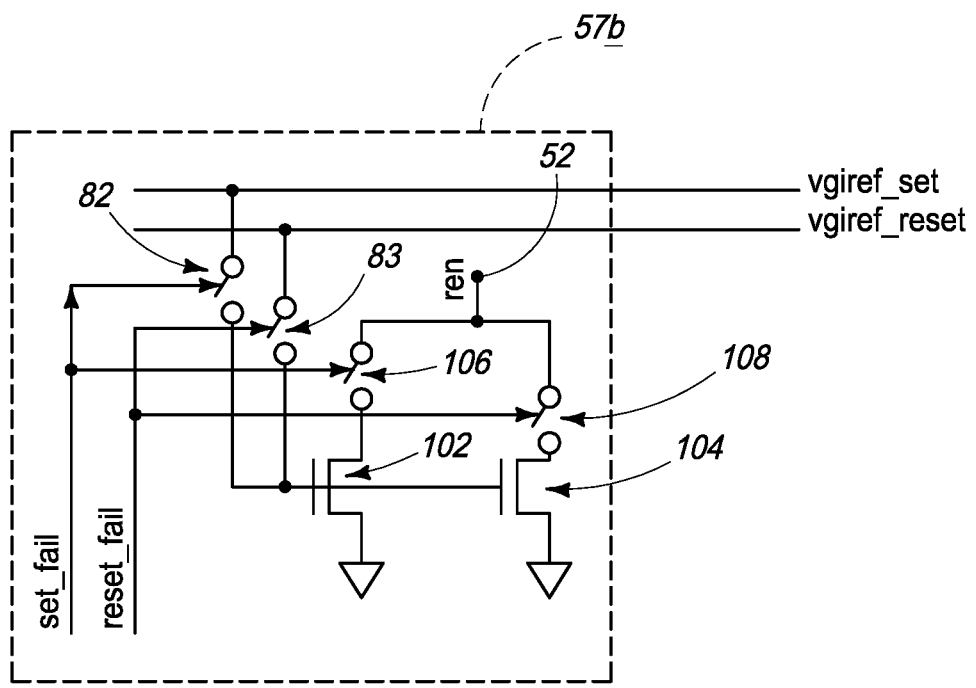
FIG. 9 is a schematic representation of reference circuitry according to one embodiment.

Referring to FIG. 9, yet another configuration of reference circuitry 57*b* is shown. Reference circuitry 57*b* includes plural NMOS transistors 102, 104 coupled with switches 106, 108 and input 52. Similar to the arrangement of FIG. 8, plural bias voltages vgiref_set and vgiref_reset are selectively coupled by respective switches 82, 83 to the gates of transistors 102, 104 corresponding to whether the target data of the memory cell to be verified is a set state or reset state, respectively.

The transistors 102, 104 and voltage sources may be configured to provide different set and reset reference currents which correspond to the expected currents of the data signal in the set and reset states, respectively, in one embodiment. In one embodiment, vgiref_set is larger than vgiref_reset to provide reference currents during set verify operations which are greater than the reference currents used during reset verify operations.

Furthermore, the device parameters of the transistors 102, 104 may also be different to provide the appropriate reference currents for set and reset verify operations. In one example embodiment, transistor 102 has a larger width to length channel ratio (and lower resistance) than transistor 104, and accordingly, transistor 102 may be used for set verify operations where the data signal current is larger than the data signal current of reset verify operations. This arrangement of reference circuitry 57*b* allows greater flexibility over a wider range of currents than the arrangements of FIGS. 6 and 8 since both transistor parameters and/or the bias voltages of the transistors 102, 104 may be varied to provide desired reference currents for set and reset verify operations.

Figure 10:
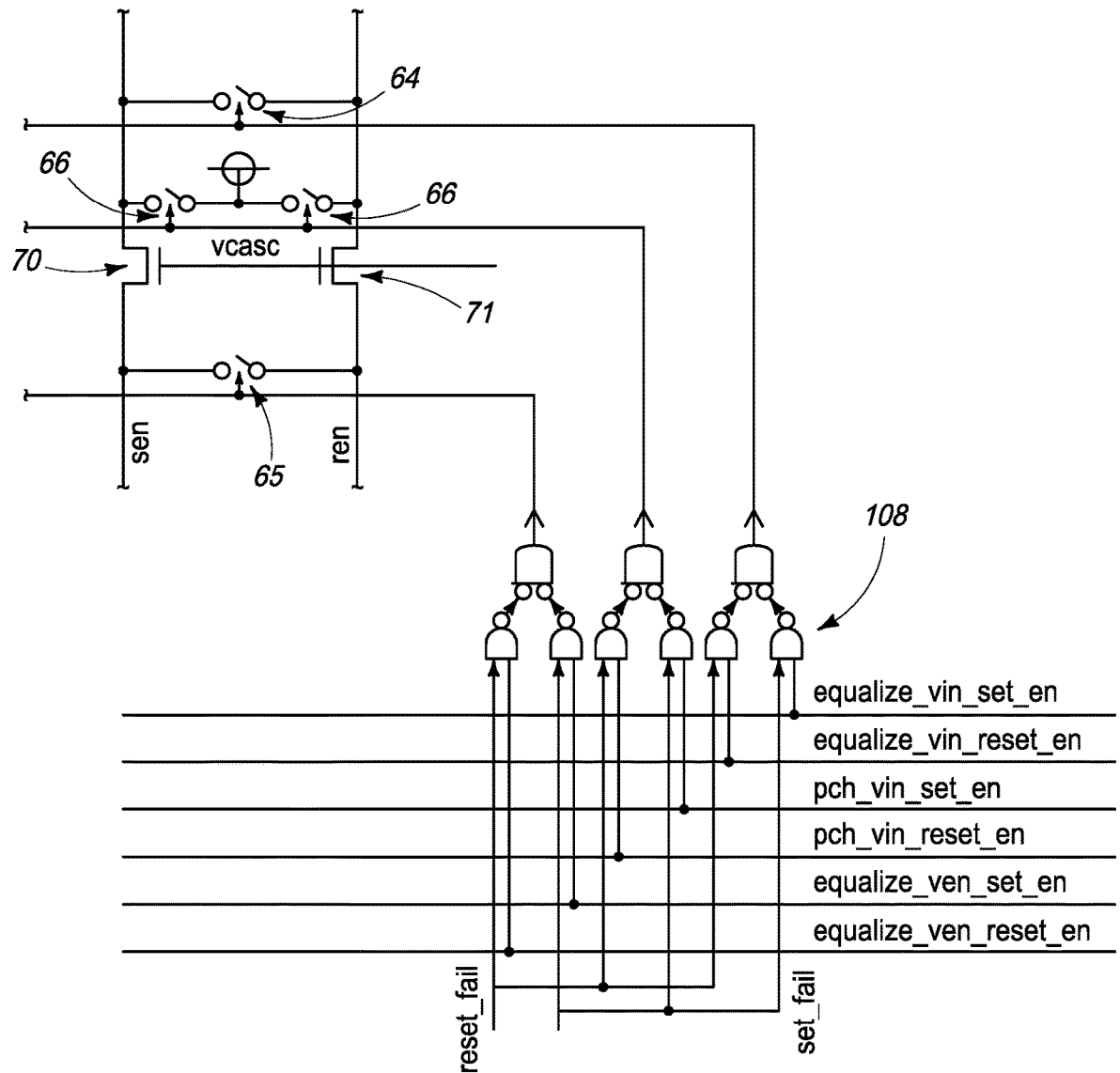
FIG. 10 is a schematic representation of equalization and pre-charge circuitry according to one embodiment.

Referring to FIG. 10, pulses having different parameters may be used to implement equalization and pre-charge operations during set and reset verify operations in one embodiment. In particular, the parameters (e.g., pulse widths) may be tailored to provide optimized sense operations based upon the target data being set or rest. For example, selection circuitry 108 controls the use of a first group of equalize and pre-charge pulses for a set verify operation and a second group of equalize and pre-charge pulses for a reset verify operation.

Figure 11:
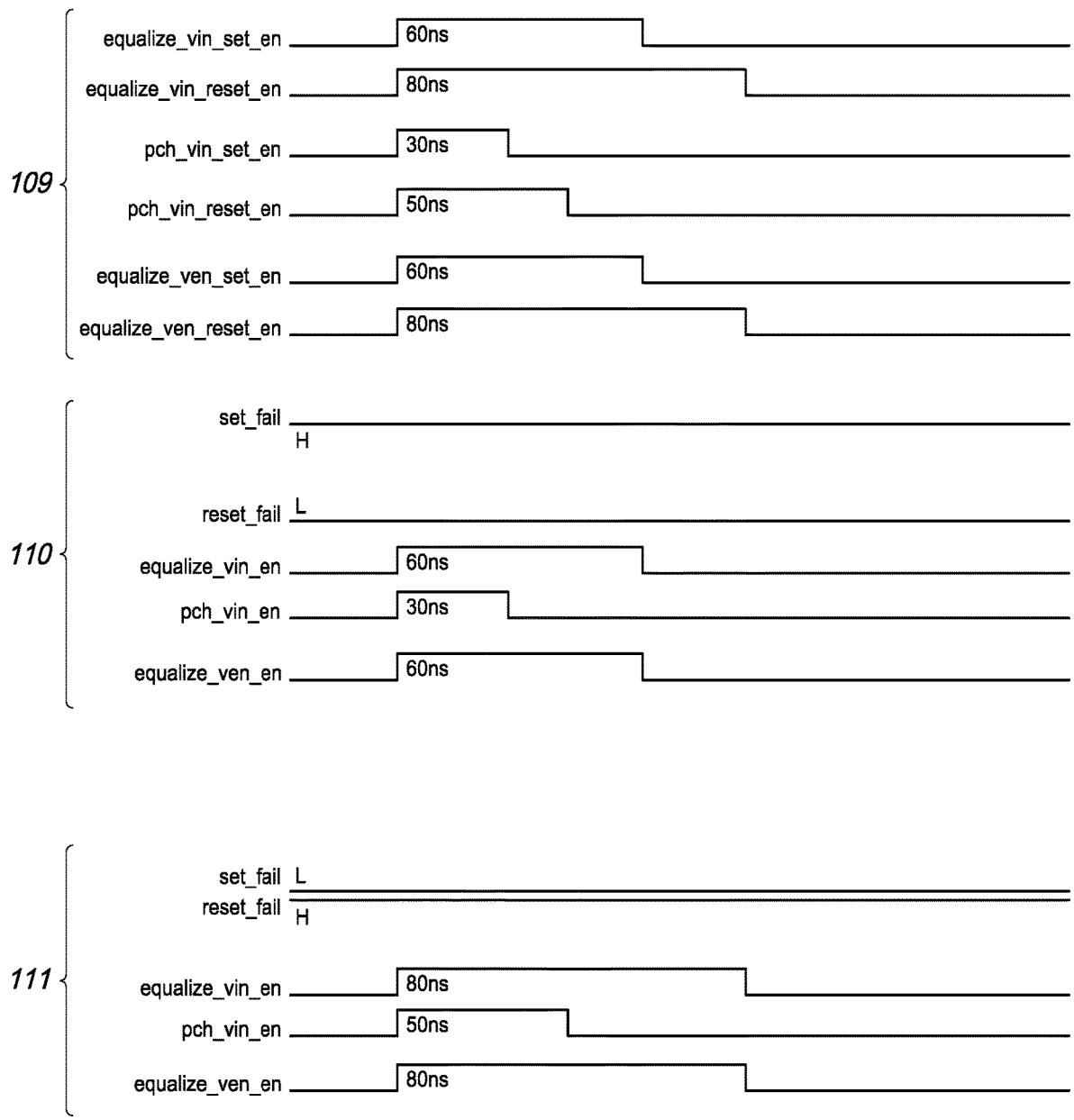
FIG. 11 is a timing diagram of equalization and pre-charge pulses according to one embodiment.

Referring to FIG. 11, a timing diagram of various signals including equalization and pre-charge pulses for the arrangement of FIG. 10 are illustrated according to one embodiment. The top group 109 of signals illustrates the signals which are input to selection circuitry 108. The middle group 110 of signals illustrates the signals which are outputted by selection circuitry 108 and applied to the sense amplifier for implementing a set verify operation. The bottom group 111 of signals illustrates the signals which are outputted by selection circuitry 108 and applied to the sense amplifier for implementing a reset verify operation. The signals of groups 110, 111 are selected to optimize the sensing of the sense amplifier 50 for set verify and reset verify operations, respectively.

More specifically, the sense amplifier's bitline charging time is dependent on cell current in one embodiment. For a given total sensing time (e.g., pre-charge+equalization+amplification) the accuracy of the sense amplifier improves somewhat if, as cell current is reduced, the pre-charge and equalization times are increased. In one embodiment, the amplification phase is delayed until after the bitline is fully charged, and bitline charging takes a longer period of time for reduced cell current. Even though the amplification time is reduced (which reduces accuracy) the overall accuracy increases because of the provision of a fully charged bitline in one example embodiment.

Figure 12:
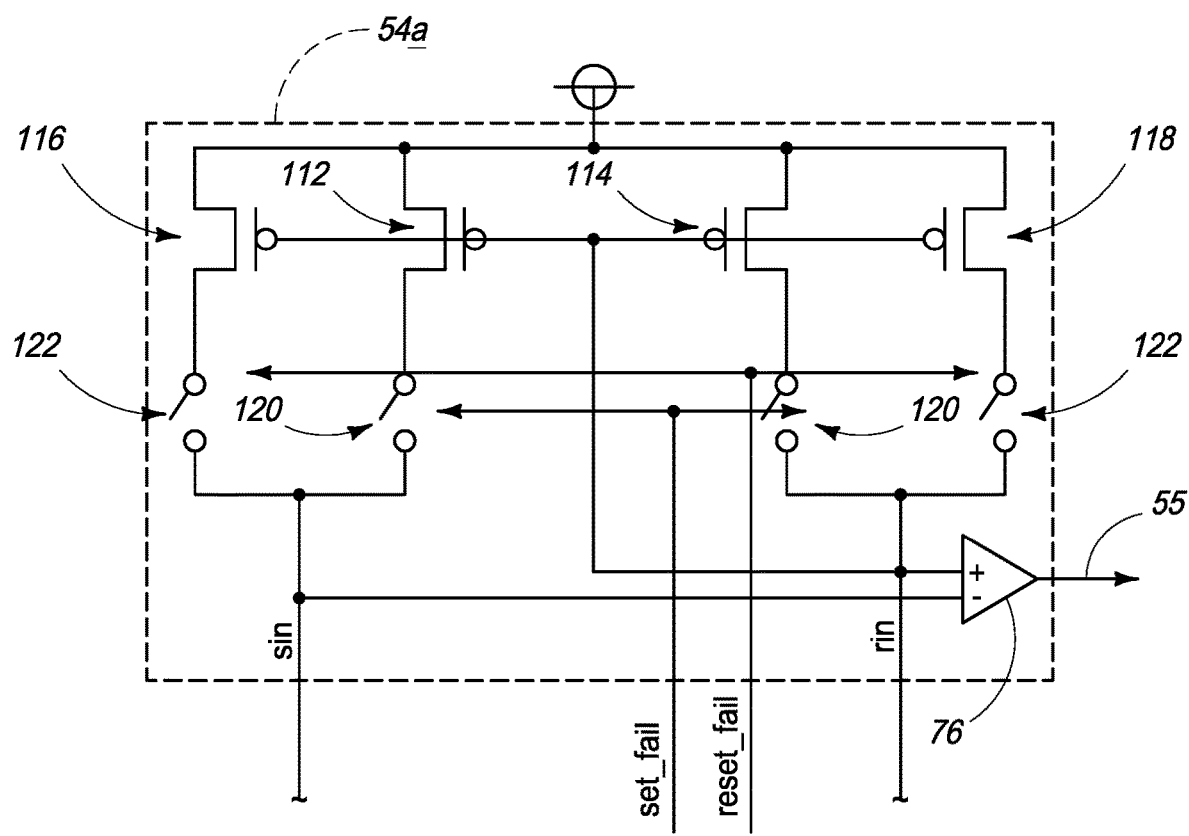
FIG. 12 is a schematic representation of comparison circuitry according to one embodiment.

Referring to FIG. 12, another embodiment of amplification and comparison circuitry 54*a* is shown. This illustrated embodiment is useful where a relatively wide range of input currents and/or relatively small currents may be compared. This embodiment includes a plurality of current mirror transistors 112, 114, 116, 118 for providing current mirror operations as previously described. In addition, circuitry 54*a* includes switches 120, 122 which are configured to select which of the transistors 112, 114, 116, 118 are used for verification of an individual bit based upon the target memory state.

For example, the device parameters (e.g., channel W/L dimensions) of the transistors may be tailored for use with either set or reset verify operations and to reduce sensitivity of circuitry 54a to device mismatch of the transistors of the current mirror. The W/L channel dimensions of transistors 112, 114 used for set verify operations may have a larger W/L ratio (and smaller resistance) than transistors 116, 118. The use of transistors 116, 118 for reset verify operations each having a larger resistance than individual transistors 112, 114 increases the voltage swings/differentials for comparison compared with use of the lower resistance transistors 112, 114. Accordingly, transistors 116, 118 may be used with the lower current signals (e.g., data and reference signals during reset verify operations) while transistors 112, 114 may be used with higher current signals (e.g., data and reference signals during set verify operations).

In addition, use of higher Vgs voltages across the current mirror transistors results in the current mirror being less susceptible to mismatch of the threshold voltages (Vth) of the current mirror transistors since the sin and rin values are each equal to Vgs−Vth of the respective current mirror transistor. Furthermore, using increased currents (for example provided by reference circuitry 57 and/or modification circuitry 53) also reduces the sensitivity of the current mirror to mismatch of the threshold voltages (Vth) of the current mirror transistors.

Conclusion

In some embodiments, a memory sense amplifier comprises a first input coupled with a memory element of a memory cell, wherein the memory element has different memory states at different moments in time, a second input configured to receive a reference signal, modification circuitry configured to provide a data signal at the first input from the memory element having a plurality of different voltages corresponding to respective ones of different memory states of the memory cell at the different moments in time, and comparison circuitry coupled with the modification circuitry and configured to compare the data signal and the reference signal at the different moments in time and to provide an output signal indicative of the memory state of the memory cell at the different moments in time as a result of the comparison to implement a plurality of verify operations of the memory states of the memory cell at the different moments in time.

In some embodiments, a memory sense amplifier further comprises a cascode transistor configured to define a voltage of a data signal from a memory cell, and supply circuitry configured to provide a first voltage bias to a gate of the cascode transistor corresponding to a first of a plurality of memory states of the memory cell to be verified at a first moment in time and a second voltage bias to the gate of the cascode transistor corresponding to a second of the memory states to be verified at a second moment in time.

In some embodiments, a memory verification method comprises accessing a plurality of target data values indicative of a plurality of memory states of the memory cell at different moments in time, accessing a data signal from the memory cell at the different moments in time, modifying the data signal differently corresponding to respective ones of the different memory states of the memory cell at the different moments in time, and using the modified data signal, verifying the memory states of the memory cell at the different moments in time.

In some embodiments, a memory verification method comprises, accessing one of a plurality of target data values to be written to a memory cell, attempting to write the one target data value to the memory cell, and using the one target data value, performing a verification operation of a memory state of the memory cell comprising accessing a data signal from the memory cell, selecting one of a plurality of modifications of the data signal corresponding to the one target data value, converting the data signal using the one modification, and using the modified data signal, determining whether the memory state of the memory cell corresponds to the one target data value.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended aspects appropriately interpreted in accordance with the doctrine of equivalents.

Further, aspects herein have been presented for guidance in construction and/or operation of illustrative embodiments of the disclosure. Applicant(s) hereof consider these described illustrative embodiments to also include, disclose and describe further inventive aspects in addition to those explicitly disclosed. For example, the additional inventive aspects may include less, more and/or alternative features than those described in the illustrative embodiments. In more specific examples, Applicants consider the disclosure to include, disclose and describe methods which include less, more and/or alternative steps than those methods explicitly disclosed as well as apparatus which includes less, more and/or alternative structure than the explicitly disclosed structure.

What is claimed is:

1. A memory system comprising:
   a memory cell configured to have a plurality of different memory states at a plurality of different moments in time, and wherein the memory cell has different electrical resistances corresponding to the different memory states; and
   sensing circuitry configured to use reference signals having different current intensities to verify placement of the memory cell in the different memory states following programming of the memory cell into the different memory states at the different moments in time.

2. The memory system of claim 1 wherein the memory cell has an increased electrical resistance in one of the memory states compared with an other of the memory states, and the sensing circuitry is configured to use a first of the reference signals to verify placement of the memory cell in the one memory state and which has an increased current intensity compared with a second of the reference signals which is used by the sensing circuitry to verify placement of the memory cell in the other memory state.

3. The memory system of claim 1 wherein the sensing circuitry is configured to use a first current source to generate a first of the reference signals to verify the placement of the memory cell in one of the memory states at one of the moments in time and to use a second current source to generate a second of the reference signals to verify the placement of the memory cell in an other of the memory states at an other of the moments in time.

4. The memory system of claim 1 wherein the sensing circuitry is configured to receive a plurality of data signals from the memory cell at the different moments in time, and to compare the reference signals with respective ones of the data signals to verify the placement of the memory cell in the different memory states at the different moments in time.

5. The memory system of claim 1 wherein the memory cell comprises dielectric material between a plurality of electrodes, and a conductive structure is provided within the dielectric material between the electrodes when the memory cell is in one of the memory states and the conductive structure is removed from the dielectric material when the memory cell is in an other of the memory states.

6. The memory system of claim 1 wherein the memory cell is a first memory cell, further comprising a second memory cell, and wherein the first and second memory cells have the different memory states at one of the moments in time, and wherein the sensing circuitry is configured to sense the different memory states of the first and second memory cells in parallel at the one moment in time.

7. A memory cell verification circuit comprising:
sensing circuitry comprising an input configured to receive a plurality of data signals from a memory cell, and wherein the data signals are indicative of a plurality of different memory states of the memory cell at a plurality of different moments in time, and wherein the sensing circuitry is configured to:
access a plurality of target data values which are indicative of the different memory states intended to be programmed to the memory cell at the different moments in time;
use the target data values to regulate the data signals differently at the different moments in time; and
use the regulated data signals to verify placement of the memory cell in the different memory states at the different moments in time.

8. The memory cell verification circuit of claim 7 wherein the memory cell has different electrical resistances in the different memory states.

9. The memory cell verification circuit of claim 7 wherein the sensing circuitry is configured to regulate one of the data signals to an increased voltage as a result of one of the target data values indicating a first of the different memory states was intended to be programmed to the memory cell at one of the moments in time and compared with regulation of an other of the data signals resulting from an other of the target data values indicating a second of the different memory states was intended to be programmed to the memory cell at an other of the moments in time.

10. The memory cell verification circuit of claim 9 wherein the memory cell has an increased electrical resistance in the first memory state compared with the electrical resistance of the memory cell in the second memory state.

11. The memory cell verification circuit of claim 7 wherein the sensing circuitry is configured to compare the regulated data signals to respective ones of a plurality of reference signals to verify the placement of the memory cell in the different memory states.

12. The memory cell verification circuit of claim 11 wherein the reference signals have increased current intensity to verify placement of the memory cell in a first of the memory states compared with the reference signals used to verify placement of the memory cell in a second of the memory states.

13. The memory cell verification circuit of claim 12 wherein the memory cell has a decreased electrical resistance in the first memory state compared with the electrical resistance of the memory cell in the second memory state.

14. The memory cell verification circuit of claim 7 wherein the sensing circuitry comprises a transistor configured to regulate the data signals, and different bias voltages are applied to a gate of the transistor to regulate the data signals differently corresponding to the target data values.

15. The memory cell verification circuit of claim 7 wherein the memory cell comprises dielectric material between a plurality of electrodes, and wherein a conductive structure is provided within the dielectric material between the electrodes when the memory cell is in one of the memory states and the conductive structure is removed from the dielectric material when the memory cell is in another of the memory states.

16. A memory cell operational method comprising:
accessing one of a plurality of different target data values to be programmed to a memory cell and which corresponds to one of a plurality of different memory states of the memory cell;
storing the one target data value;
programming the memory cell to the one memory state according to the stored one target data value; and
after the programming, verifying placement of the memory cell into the one memory state using the stored one target data value.

17. The memory cell operational method of claim 16 wherein the memory cell has different electrical resistances in the different memory states.

18. The memory cell operational method of claim 16 further comprising regulating a data signal from the memory cell to an increased voltage as a result of the stored one target data value indicating that the one memory state was intended to be programmed to the memory cell and compared with regulation of the data signal as a result of the stored one target data value indicating that an other of the different memory states was intended to be programmed to the memory cell, and wherein the regulated data signal is used to verify the placement of the memory cell into the one memory state.

19. The memory cell operational method of claim 18 wherein the memory cell has an increased electrical resistance in the one memory state compared with the electrical resistance of the memory cell in the other memory state.

20. The memory cell operational method of claim 18 wherein the regulating comprises regulating using a transistor, and further comprising biasing a gate of the transistor using one of a plurality of different bias voltages which corresponds to the stored one target data value.

21. The memory cell operational method of claim 16 wherein the verifying comprises comparing a data signal from the memory cell with a reference signal.

22. The memory cell operational method of claim 21 further comprising generating the reference signal having one of a plurality of different current intensities using the stored one target data value.

23. The memory cell operational method of claim 22 wherein the memory cell has different electrical resistances in the different memory states, and wherein the generating comprises generating the reference signal to have a first current intensity when the memory cell was programmed to have an increased electrical resistance and generating the reference signal to have a second current intensity when the memory cell was programmed to have a decreased electrical resistance, and wherein the first current intensity is less than the second current intensity.

24. A memory system comprising:
a memory cell configured to have a plurality of different memory states at a plurality of different moments in time, and wherein the memory cell has different electrical resistances corresponding to the different memory states;
sensing circuitry configured to use reference signals having different current intensities to verify placement of the memory cell in the different memory states at the different moments in time; and wherein the memory cell has an increased electrical resistance in one of the memory states compared with an other of the memory states, and the sensing circuitry is configured to use a first of the reference signals to verify placement of the memory cell in the one memory state and which has an increased current intensity compared with a second of the reference signals which is used by the sensing circuitry to verify placement of the memory cell in the other memory state.

25. A memory system comprising:

a memory cell configured to have a plurality of different memory states at a plurality of different moments in time, and wherein the memory cell has different electrical resistances corresponding to the different memory states;

sensing circuitry configured to use reference signals having different current intensities to verify placement of the memory cell in the different memory states at the different moments in time; and wherein the memory cell is a first memory cell and further comprising a second memory cell, and wherein the first and second memory cells have the different memory states at one of the moments in time, and wherein the sensing circuitry is configured to sense the different memory states of the first and second memory cells in parallel at the one moment in time.

26. A memory cell operational method comprising:

accessing one of a plurality of different target data values to be programmed to a memory cell and which corresponds to one of a plurality of different memory states of the memory cell;

programming the memory cell to the one memory state according to the one target data value;

after the programming, verifying placement of the memory cell into the one memory state using the one target data value; and regulating a data signal from the memory cell to an increased voltage as a result of the one target data value indicating that the one memory state was intended to be programmed to the memory cell and compared with regulation of the data signal as a result of the one target data value indicating that an other of the different memory states was intended to be programmed to the memory cell, and wherein the regulated data signal is used to verify the placement of the memory cell into the one memory state.

27. The memory cell operational method of claim 26 wherein the memory cell has an increased electrical resistance in the one memory state compared with the electrical resistance of the memory cell in the other memory state.

28. The memory cell operational method of claim 26 wherein the regulating comprises regulating using a transistor, and further comprising biasing a gate of the transistor using one of a plurality of different bias voltages which corresponds to the one target data value.

29. A memory cell operational method comprising:

accessing one of a plurality of different target data values to be programmed to a memory cell and which corresponds to one of a plurality of different memory states of the memory cell;

programming the memory cell to the one memory state according to the one target data value;

after the programming, verifying placement of the memory cell into the one memory state using the one target data value;

generating a reference signal having one of a plurality of different current intensities using the one target data value;

wherein the verifying comprises comparing a data signal from the memory cell with the reference signal; and wherein the memory cell has different electrical resistances in the different memory states, and wherein the generating comprises generating the reference signal to have a first current intensity when the memory cell was programmed to have an increased electrical resistance and generating the reference signal to have a second current intensity when the memory cell was programmed to have a decreased electrical resistance, and wherein the first current intensity is less than the second current intensity.

* * * * *